US007928742B2

(12) United States Patent
Trunzer

(10) Patent No.: US 7,928,742 B2
(45) Date of Patent: Apr. 19, 2011

(54) DIGITAL MEASUREMENT TRANSMITTER WITH CURRENT SIGNAL

(75) Inventor: Wolfgang Trunzer, Lörrach (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 714 days.

(21) Appl. No.: 11/578,838

(22) PCT Filed: Mar. 23, 2005

(86) PCT No.: PCT/EP2005/051344
§ 371 (c)(1),
(2), (4) Date: Jul. 30, 2007

(87) PCT Pub. No.: WO2005/101345
PCT Pub. Date: Oct. 27, 2005

(65) Prior Publication Data

US 2008/0030356 A1 Feb. 7, 2008

(30) Foreign Application Priority Data

Apr. 19, 2004 (DE) ........................ 10 2004 019 392

(51) Int. Cl.
*G01R 31/08* (2006.01)
*G01R 27/00* (2006.01)

(52) U.S. Cl. ........................ 324/713; 324/522; 324/600

(58) Field of Classification Search .................. 324/600, 324/713, 522
See application file for complete search history.

(56) References Cited

U.S. PATENT DOCUMENTS 4,442,397 A 4/1984 Ishikawa
4,962,352 A 10/1990 Ogawa
5,440,603 A * 8/1995 Sugita ............................ 377/20
5,850,514 A * 12/1998 Gonda et al. .................... 714/55
6,985,581 B1 * 1/2006 Callum ............................ 380/2

FOREIGN PATENT DOCUMENTS

| | | | |
|---|---|---|---|
| DE | 33 22 242 | A1 | 1/1984 |
| DE | 38 78 253 | T2 | 6/1993 |
| DE | 693 12 344 | T2 | 1/1998 |
| DE | 299 17 651 | U1 | 12/2000 |
| JP | 2000035903 | A | 2/2000 |
| WO | WO 03/060851 | A1 | 7/2003 |
| WO | WO 2005/017851 | A1 | 2/2005 |

* cited by examiner

*Primary Examiner* — Timothy J Dole
*Assistant Examiner* — Farhana Hoque
(74) *Attorney, Agent, or Firm* — Bacon & Thomas, PLLC

(57) ABSTRACT

A measurement transmitter, including: A microprocessor having a reset input and a clock output for providing a periodic clock signal; a monitoring circuit having a clock signal input and a reset output; and a current controller for issuing in a band range, during operation, a measurement signal current representing a measured value. The clock signal input is connected with the clock signal output and the reset input with the reset output. Upon absence of the clock signal, the reset output periodically issues a reset signal. The measurement transmitter further includes a comparator circuit having a first input, which is connected via a lowpass with the reset output of the monitoring circuit, and a second input, on which a reference voltage is applied. An output of the comparator circuit is connected with the current controller. After repeated output of the reset signal, the voltage at the first input of the comparator circuit moves above the reference voltage, so that a control signal is then present on the output of the comparator. The control signal causes the current controller to issue an error signal outside of the band range.

8 Claims, 2 Drawing Sheets

DIGITAL MEASUREMENT TRANSMITTER WITH CURRENT SIGNAL

FIELD OF THE INVENTION

The present invention relates to a digital measurement transmitter, especially a measurement transmitter with an electric current signal, in the case of which, thus, the measured value is output by control of a signal current, or feed current, as the case may be.

BACKGROUND OF THE INVENTION

Digital measurement transmitters are those which include at least one microprocessor for conditioning the measurement signals, or for controlling internal functions. Especially in safety-relevant applications, it is necessary to be able to recognize a malfunctioning of a measurement transmitter, or its components, with a sufficiently high probability. In the NAMUR Recommendation NE43, it is, for example, proposed, that, in the case of measuring devices having a measurement signal current lying in a band range between 4 and 20 mA, a device malfunction be signalled with an error signal current outside of this band range, e.g. not more than 3.6 mA, or, on the other end, at least 21 mA.

SUMMARY OF THE INVENTION

An object of the present invention is to provide a digital measurement transmitter, which signals a malfunctioning of its microprocessor with certainty.

The measurement transmitter of the invention includes: A microprocessor having a reset input and a clock output for providing a periodic clock signal; a monitoring circuit having a clock input and a reset output; and a current controller, or regulator, for output of a measurement signal current, which represents, during measurement operation, a measured value in a first band range and signals a malfunction outside of the first band range; wherein the clock input of the monitoring circuit is connected with the clock output of the microprocessor, the reset-input of the microprocessor is connected with the reset output of the monitoring circuit, and, in the case of loss of the clock signal, a reset signal is periodically output on the reset output of the monitoring circuit; wherein, further, the measurement transmitter has a comparator circuit having a first input, which is connected via a lowpass with the reset output of the monitoring circuit, a second input, to which a reference voltage is applied, and an output, which is connected with an input of the current controller, wherein, after repeated output of the reset signal, the voltage on the first input of the comparator circuit exceeds the reference voltage, so that, on the output of the comparator, a control signal is present, which causes the current controller to output an error signal current outside of the first band range.

As indicated above, the first band range for the measurement signal current amounts to, for example, 4 to 20 mA. In this case, the error signal current should be, at least, 21 mA or, at most, 3.6 mA. In a currently preferred form of embodiment, the error signal current is controlled to 22 mA.

The monitoring circuit can include, for example, a digital counter, which counts from a starting value and, upon exceeding or falling beneath of a limit value, causes a reset signal to appear on the reset-output. The counter is set back to its starting value both by each pulse of the clock signal of the microprocessor and also by the reset signal of the monitoring circuit. The limit value is, in such case, so selected with reference to the counting speed of the counter and the clock frequency of the microprocessor, that the limit value in the case of functioning clock signal is never fallen beneath, or exceeded, as the case may be. Additionally, the limit value is so selected, that, following issue of a reset signal, sufficient time remains for starting the microprocessor anew, following a simple clock disturbance, so that, at the output of the microprocessor, again the clock signal is output, before the limit value is reached. Consequently, only when, in the expected time, a reset signal has not led to a successful reset, is another reset signal output.

It is currently preferred that the lowpass, via which the output signal of the monitoring circuit is fed to the comparator circuit, include an RC element. The comparator circuit includes, preferably, a first operational amplifier.

In a currently preferred embodiment of the invention, the current controller includes two parallel current control circuits, of which the first controls the measurement signal current in the first band range and the second controls the error signal current to a value outside of the first band range.

The second current control circuit can, to this end, include a second operational amplifier, whose one input is connected with the output of the comparator circuit and whose output is connected with the base of a transistor, via which the error signal current is set. It is currently preferred, that the internal voltage supply of the second operational amplifier for controlling the error signal current occur independently of the voltage supply of the current control circuit for controlling the measurement signal current. In this way, it is assured that the error signal current can also be set, when the voltage supply of the current control circuit for the measurement signal current is lost.

The first current control circuit for controlling the measurement signal current can be embodied similarly to the second current control circuit, wherein, in the case of a currently preferred form of embodiment, the measurement transmitter includes an ASIC and parts of the first current control circuit are integrated into the ASIC.

BRIEF DESCRIPTION OF THE DRAWINGS

Further details and ways of considering the invention will become apparent on the basis of the dependent claims, and on the basis of the example of an embodiment shown in the drawings, the figures of which show as follows:

DESCRIPTION OF THE PREFERRED EMBODIMENTS

Figure 1:
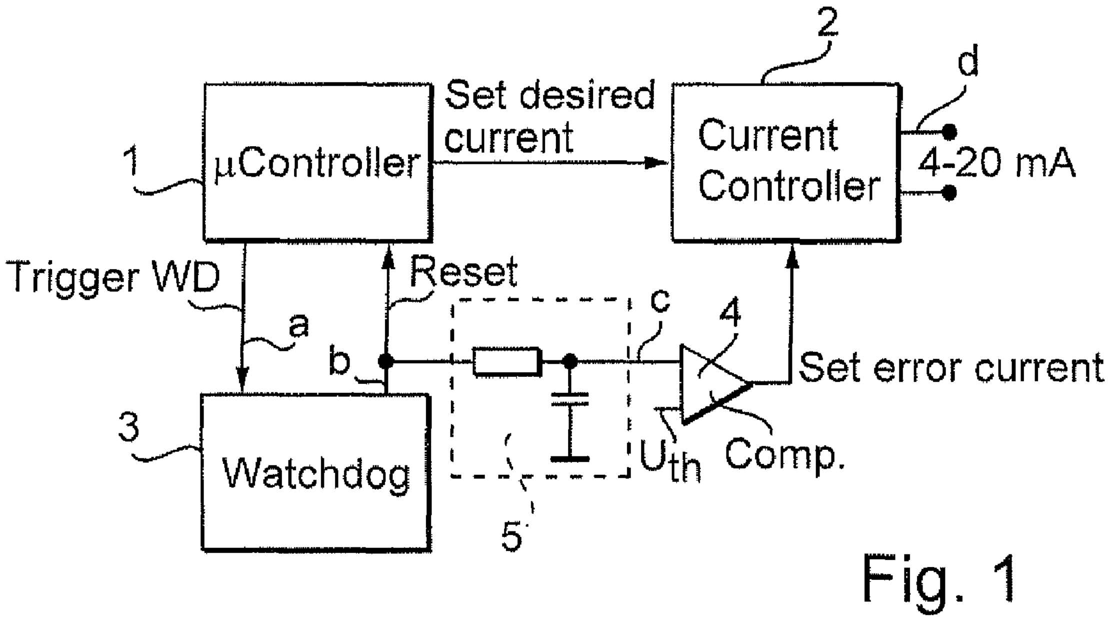
FIG. 1 a block circuit diagram of a measurement transmitter of the invention.
Figure 2:
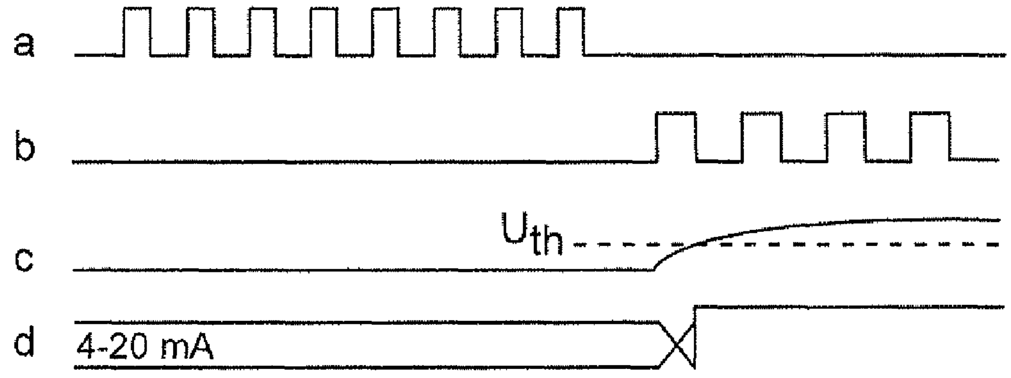
FIG. 2 signals, as a function of time, at the test points indicated in FIG. 1.

The circuit of a measurement transmitter of the invention, as shown in FIG. 1, includes a microprocessor 1 having a reset input and a clock, or trigger, output providing a periodic clock signal, which is illustrated by curve a in FIG. 2. Additionally, a current controller 2 is provided, which controls the feed current of the measurement transmitter to lie, as a measurement signal current, between 4 and 20 mA. Current controller 2 receives from microprocessor 1, in normal measurement operation, a control signal, set-current, which represents a measured value, and controls the feed current to a value corresponding to the control signal. The measurement transmitter includes, furthermore, a monitoring circuit 3, with a clock signal input and a reset output, the signal of which is represented by curve b in FIG. 2. As long as the clock signal of the microprocessor is received, the reset output of the monitoring circuit remains at zero. When, however, the clock signal is lost, then issued at the reset output is a reset pulse, which is repeated after a certain time, when the reset was not successful, and the clock signal of the microprocessor continues to be absent. The signal of the reset output is, additionally, fed via a lowpass 5 to the input of a comparator 4, which comprises a first operational amplifier. The signal at the comparator input is shown by curve c. In the case of unsuccessful reset, plural reset pulses lead to a voltage rise, until the reference voltage on the reference input of the comparator 4 is exceeded. Thereupon, the voltage at the output of the comparator 4 is set higher, and output as error control signal to the current controller 2, which now issues the feed current at an error signal level of, for example, 22 mA. The general behavior of the feed current is shown schematically by the graph d in FIG. 2. As shown, the value of the feed current lies, during normal measurement operation, in the band between 4 and 20 mA, and, following an undefined transition, which is indicated in the curve by the X, it is controlled to 22 mA.

Figure 3:
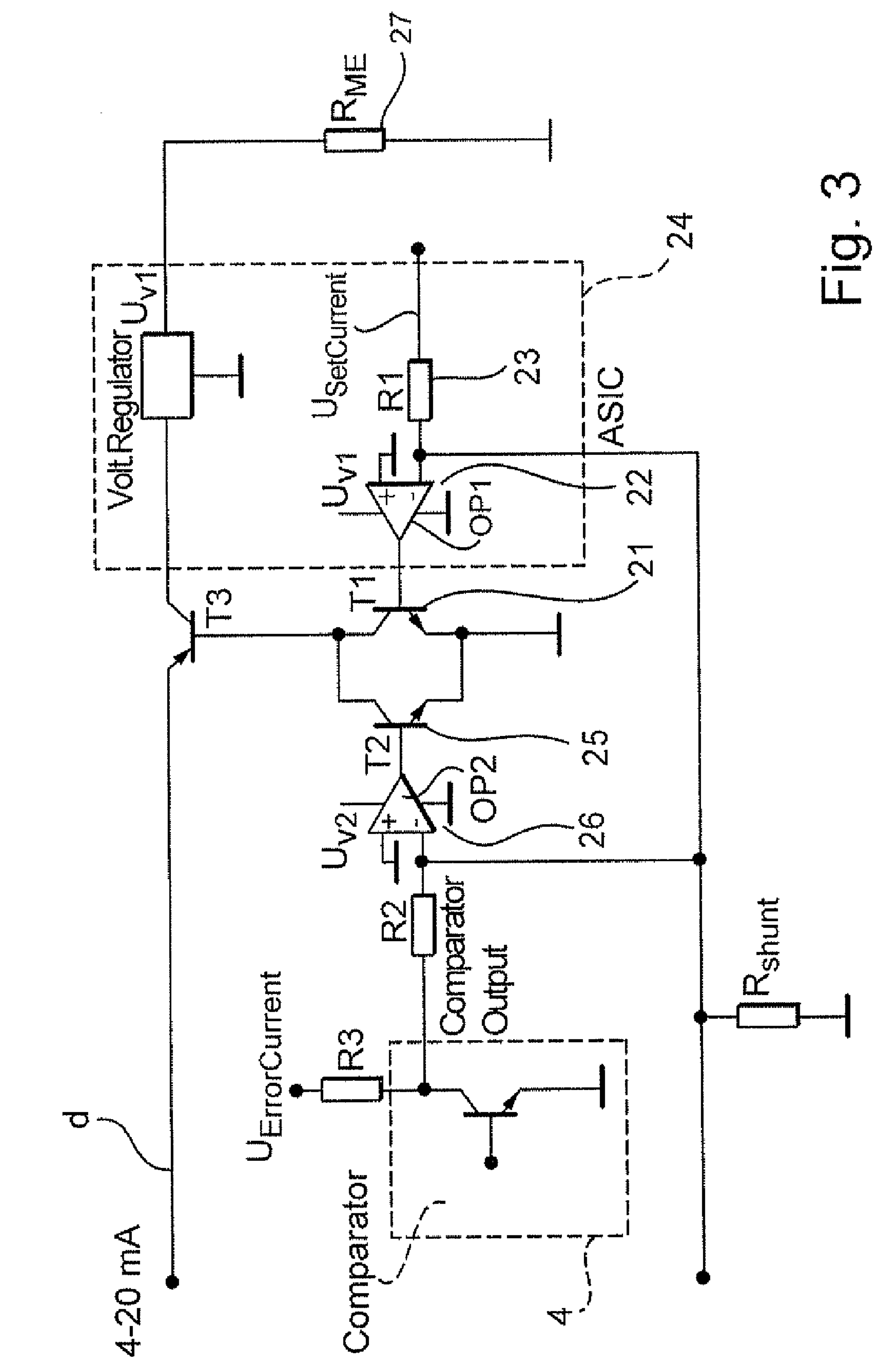
FIG. 3 an example of a current controller for implementing the present invention.

Details of the current controller 2 are briefly described on the basis of FIG. 3. The illustrated current controller 2 includes two current control circuits connected in parallel, of which the first controls the measurement signal current in the first band range and the second the error signal current at a value outside of the first band range.

Both current control circuits include, essentially, in each case, a current control transistor 21, 25, whose base is, in each case, connected to the output of an operational amplifier 22, 26. Applied to the inputs of the operational amplifiers 22, 26 is, in each case, a control voltage, for control of the measurement signal current, or the error signal current, as the case may be. Applied to the second operational amplifier 26 of the second current control circuit is the output of the comparator 4, through a series resistor R2. The reference input of the second operational amplifier lies at ground. When, now, the output of the comparator 4 is likewise at ground, then the output signal of the second operational amplifier is at ground, and the second transistor blocks. When, in contrast, in the case of a persisting absence of the clock signal of the microprocessor, comparator 4 issues a control signal $Uv_{errorcurrent}$, then the second operational amplifier 26 issues a voltage, which decreases the resistance of the second transistor 25, so that a current flows through the second transistor, which effects a total feed current of 22 mA.

the resistance of the main electronics, which is supplied by the feed current, and which is not shown in detailed here, is summarized in this drawing by the resistor 27, or $R_{ME}$.

The first current control circuit for controlling the measurement signal current is, in principle, constructed similarly to the second current control circuit, with, in the case of the illustrated form of embodiment, the measurement transmitter including an ASIC 24, and the operational amplifier 22 of the first current control circuit being integrated into the ASIC 24.

The invention claimed is:

1. A measurement transmitter, comprising:

a microprocessor having a reset input and a clock signal output for providing a periodic clock signal;

a monitoring circuit having a clock signal input and a reset output;

a current controller for output of a measurement signal current representing during measurement operation a measured value in a first band range and signaling a malfunction when outside of the first band range and a comparator circuit having a first input, which is connected via a lowpass with the reset output of said monitoring circuit, a second input, on which a reference voltage is applied, and an output, which is connected with an input of said current controller, wherein:

the clock signal input of the monitoring circuit is connected with the clock signal output of said microprocessor;

the reset input of said microprocessor is connected with the reset output of said monitoring circuit;

in case of an absence of the clock signal, a reset signal is periodically issued on the reset output of said monitoring circuit;

following repeated output of the reset signal, voltage at the first input of the comparator exceeds the reference voltage, so that, present at the output of the comparator, is a control signal, which causes the current controller to issue an error signal current outside of the first band range; and said comparator circuit comprises an operational amplifier.

2. The measurement transmitter as claimed in claim 1, wherein:

said lowpass comprises an RC-element.

3. The measurement transmitter as claimed in claim 1, wherein:

the first band range amounts to 4 to 20 mA.

4. The measurement transmitter as claimed in claim 3, wherein:

the error signal current amounts to at least 21 mA.

5. The measurement transmitter as claimed in claim 1, wherein:

said monitoring circuit comprises a digital counter, which counts beginning with a starting value and, upon exceeding or falling beneath a limit value, causes output of a reset signal, said counter is set back to its starting value by each pulse of the clock signal of said microprocessor and also by the reset signal of said monitoring circuit.

6. The measurement transmitter as claimed in claim 1, wherein said:

current controller comprises two parallel current control circuits, of which the first controls the measurement signal current in the first band range and the second controls the error signal current to a value outside of the first band range.

7. A measurement transmitter, comprising:

a microprocessor having a reset input and a clock signal output for providing a periodic clock signal;

a monitoring circuit having a clock signal input and a reset output; and a current controller for output of a measurement signal current representing during measurement operation a measured value in a first band range and signaling a malfunction when outside of the first band range, said measurement transmitter further comprising a comparator circuit having a first input, which is connected via a lowpass with the reset output of said monitoring circuit, a second input, on which a reference voltage is applied, and an output, which is connected with an input of said current controller, wherein:

the clock signal input of the monitoring circuit is connected with the clock signal output of said microprocessor;

the reset input of said microprocessor is connected with the reset output of said monitoring circuit;

in case of an absence of the clock signal, a reset signal is periodically issued on the reset output of said monitoring circuit; and following repeated output of the reset signal, voltage at the first input of the comparator exceeds the reference voltage, so that, present at the output of the comparator, is a control signal, which causes the current controller to issue an error signal current outside of the first band range;

current controller comprises two parallel current control circuits, of which the first controls the measurement signal current in the first band range and the second controls the error signal current to a value outside of the first band range; and said second current control circuit comprises a second operational amplifier, of which an input is connected with the output of said comparator, and an output is connected with the base of a transistor, via which the error signal is controlled.

8. The measurement transmitter as claimed in claim 7, wherein:

the voltage supply of said second operational amplifier for said control of the error signal current is independent of the voltage supply of said current control circuit for controlling the measurement signal current.

* * * * *